US006975516B2

(12) United States Patent
Asahi et al.

(10) Patent No.: US 6,975,516 B2
(45) Date of Patent: Dec. 13, 2005

(54) COMPONENT BUILT-IN MODULE AND METHOD FOR PRODUCING THE SAME

(75) Inventors: Toshiyuki Asahi, Osaka (JP); Yasuhiro Sugaya, Toyonaka (JP); Shingo Komatsu, Kadoma (JP); Yoshiyuki Yamamoto, Neyagawa (JP); Seiichi Nakatani, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 321 days.

(21) Appl. No.: 10/272,599

(22) Filed: Oct. 15, 2002

(65) Prior Publication Data

US 2003/0090883 A1 May 15, 2003

(30) Foreign Application Priority Data

Oct. 18, 2001 (JP) ....................................... 2001-320704

(51) Int. Cl.[7] .................................................. H05K 7/06

(52) U.S. Cl. ....................... 361/761; 361/762; 361/764; 361/795; 174/258; 174/260; 257/700; 257/724

(58) Field of Search ................................ 361/761–764, 361/792, 793, 795; 174/256, 258–260; 257/700, 723, 724; 438/977

(56) References Cited

U.S. PATENT DOCUMENTS

| | | | | |
|---|---|---|---|---|
| 5,353,195 A | | 10/1994 | Fillion et al. | |
| 5,497,033 A | * | 3/1996 | Fillion et al. | 257/723 |
| 5,564,181 A | * | 10/1996 | Dineen et al. | 29/841 |
| 5,872,051 A | | 2/1999 | Fallon et al. | |
| 5,874,770 A | | 2/1999 | Saia et al. | |
| 5,880,530 A | * | 3/1999 | Mashimoto et al. | 257/783 |
| 6,038,133 A | | 3/2000 | Nakatani et al. | |

(Continued)

FOREIGN PATENT DOCUMENTS

| | | |
|---|---|---|
| EP | 0 774 888 | 5/1997 |
| EP | 0 920 058 | 6/1999 |
| EP | 1 069 616 | 1/2001 |
| JP | 5-259372 | 10/1993 |
| JP | 6-350211 | 12/1994 |
| JP | 7-154073 | 6/1995 |
| JP | 7-307407 | 11/1995 |
| JP | 9-46046 | 2/1997 |
| JP | 10-284632 | 10/1998 |
| JP | 11-103147 | 4/1999 |
| JP | 11-126978 | 5/1999 |
| JP | 11-163249 | 6/1999 |
| JP | 11-220262 | 8/1999 |
| JP | 2000-4071 | 1/2000 |
| JP | 2000-208662 | 7/2000 |
| JP | 2001-44641 | 2/2001 |
| JP | 2001-60602 | 3/2001 |
| JP | 2001-210776 | 8/2001 |
| JP | 2001-244638 | 9/2001 |

*Primary Examiner*—John B. Vigushin
(74) *Attorney, Agent, or Firm*—Hamre, Schumann, Mueller & Larson P.C.

(57) ABSTRACT

A component built-in module includes an insulating layer, wirings integrated with both surfaces of the insulating layer, a via connecting the wirings, and one or more components selected from an electronic component and a semiconductor, which is embedded inside of the insulating layer. In this module, at least one of the wirings is formed on a surface of a wiring board, and the components embedded inside of the insulating layer are mounted on and integrated with the wiring board before embedding. This configuration allows the components such as a semiconductor to undergo a mounting inspection and a property inspection before embedding. As a result, the yields of the module can be improved. In addition, since the components are integrated with the wiring board and embedded, the strength thereof can be enhanced.

26 Claims, 8 Drawing Sheets

U.S. PATENT DOCUMENTS

| | | | | | |
|---|---|---|---|---|---|
| 6,429,386 | B2 | * | 8/2002 | DiBene et al. | 174/260 |
| 6,570,469 | B2 | | 5/2003 | Yamada et al. | |
| 6,576,499 | B2 | | 6/2003 | Funaya et al. | |
| 6,784,765 | B2 | | 8/2004 | Yamada et al. | |
| 2001/0030059 | A1 | * | 10/2001 | Sugaya et al. | 174/256 |
| 2002/0076919 | A1 | | 6/2002 | Peters et al. | |
| 2002/0119396 | A1 | | 8/2002 | Jiang et al. | |
| 2002/0175402 | A1 | * | 11/2002 | McCormack et al. | 257/700 |
| 2003/0038373 | A1 | | 2/2003 | Cohn et al. | |
| 2003/0075811 | A1 | | 4/2003 | Cohn et al. | |

* cited by examiner

COMPONENT BUILT-IN MODULE AND METHOD FOR PRODUCING THE SAME

BACKGROUND OF THE INVENTION

1. Field of the Invention

The present invention relates to a circuit component built-in module in which a circuit component is arranged in an internal portion of an insulating layer and a method for producing the same.

2. Related Background Art

Recently, with a trend toward high performance and miniaturization of electronic equipment, high-density and high-performance circuit components increasingly have been desired. This leads to a demand for a module with circuit components mounted thereon commensurate with high-performance and high-density. In order to achieve high-density mounting of circuit components, circuit boards currently tend to be multilayered. However, a conventional glass-epoxy resin impregnation board employs a through-hole structure formed with a drill to form a multilayered circuit, which has a high reliability but is not suitable for high-density mounting. Therefore, a multilayered circuit board employing a connection method using inner vias also is utilized in order to achieve a circuit with higher density. The inner via connection can connect wiring patterns of LSIs or circuit components in the shortest distance and allows the connection only between the layers necessary to be connected, so that this method has excellent capabilities for mounting circuit components. In addition, minute wiring patterning also is essential technology for high-density mounting, and therefore lines and spaces are miniaturized with each passing year. Moreover, three-dimensional mounting has been developed, where passive components are formed inside of a board.

However, in order to form the passive components inside of a board, there are many problems concerning development of materials, the accuracy of formation, spending on new plant and equipment, and the like, and therefore the speed of the development would be delayed.

The Applicants of the present invention proposed that passive components were embedded inside of a board (JP 11(1999)-220262, U.S. Pat. No. 6,038,133). According to the examples of this proposal, wiring is formed after embedding components inside of the board. Therefore, this method has a problem in that components such as semiconductors cannot be inspected in a mounted state (hereinafter called "mounting inspection") and cannot be inspected as to their properties (hereinafter called "property inspection") before embedding. Furthermore, since a wiring board is not embedded integrally, the strength thereof is not so high.

SUMMARY OF THE INVENTION

Therefore, with the foregoing in mind, it is an object of the present invention to provide a component built-in module that allows a component such as a semiconductor to be inspected as to the mounted state or their properties before embedding, which leads to the improvement of the yields, and moreover can enhance the strength and realize a high degree of productivity and high-density mounting.

To fulfill the above-stated object, a component built-in module of the present invention includes an insulating layer, wirings integrated with both surfaces of the insulating layer, a via connecting the wirings, and one or more components selected from an electronic component and a semiconductor that is embedded inside of the insulating layer. In this module, at least one of the wirings is formed on a surface of a wiring board and the components embedded inside of the insulating layer are mounted on and integrated with the wiring board before embedding.

A method of producing a component built-in module according to the present invention is as follows. Here, the component built-in module includes an insulating layer, wirings integrated with both surfaces of the insulating layer, a via connecting the wirings, and one or more components selected from an electronic component and a semiconductor that are embedded inside of the insulating layer. In the module, at least one of the wirings is formed on a surface of a wiring board. The method includes the steps of: mounting the one or more components selected from an electronic component and a semiconductor on the wiring board; forming the via along a thickness direction of the insulating layer, where the insulating layer is made of a thermosetting resin in a semi-cured state; embedding the components in the insulating layer so that the wiring board is arranged outside; and curing the insulating layer.

DETAILED DESCRIPTION OF THE INVENTION

Figure 1:
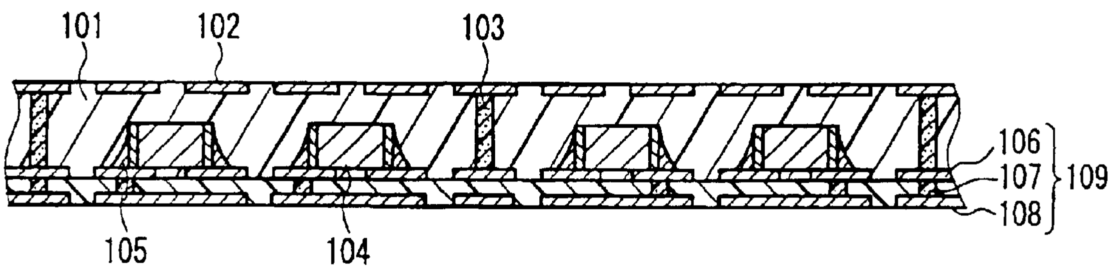
FIG. 1 is a cross-sectional view of a component built-in module according to Embodiment 1 of the present invention.

A component built-in module according to the present invention includes an insulating layer, wirings integrated with both surfaces of the insulating layer, a via connecting the wirings, and one or more components selected from an electronic component and a semiconductor that is embedded inside of the insulating layer. In this module, at least one of the wirings is formed on a surface of a wiring board and the components embedded inside of the insulating layer is mounted on and integrated with the wiring board before embedding. This configuration allows the components such as a semiconductor to undergo a mounting inspection and a property inspection before embedding. As a result, the yields of the module can be improved. In addition, since the components are integrated with the wiring board and embedded, the strength thereof can be enhanced. Moreover, this configuration can provide a component built-in module that has a high degree of productivity and is capable of high-density mounting. In the above description, to embed the components means that the components are entirely within a geometric solid defined by the surfaces of the insulating layer.

In the present invention, it is preferable that the wiring board is a double-sided wiring board or a multilayered wiring board. This configuration facilitates the formation of a complicated circuit.

In the present invention, it is preferable that the electronic component and/or the semiconductor inside of the insulating layer (hereinafter generically called "components") are mounted on the wiring pattern and/or the wiring boards provided on the both surfaces of the insulating layer. By mounting the components on the both surfaces and embedding the same in the insulating layer, a module having a higher-density component built-in layer can be provided.

In the present invention, it is preferable that the components are arranged so as not to coincide with each other in the direction of the normal to the main surfaces of the insulating layer. With this configuration, components can be arranged with higher density by a mounter, irrespective of a mountable space. In addition, the thickness of the insulating layer can be reduced, which leads to high-density mounting.

In the present invention, it is preferable that a shielding layer is inserted between the wiring patterns on the both surfaces of the insulating layer and/or the components mounted on the wiring board. With this configuration, some or all of the interference between the built-in components, the interference with the built-in components from the outside and the radiation from the built-in components to the outside can be reduced, thus enhancing the module properties.

In the present invention, it is preferable that the shielding layer is a wiring pattern of metal foil or is made of a material having a function of electromagnetic shielding. In the case of employing the wiring pattern of metal foil, the shielding layer can be formed with the same process as that of the wiring pattern, which facilitates the manufacturing thereof. In the case of the material having a function of electromagnetic shielding, the shielding layer can be formed simply by changing a material of the insulating layer, and therefore the interference can be reduced without changing the manufacturing process.

In the present invention, it is preferable that the components are mounted on a main surface of the wiring pattern and/or the wiring board, where the main surface does not face the insulating layer. With this configuration, the components can be mounted not only in the insulating layer but also on such an opposite main surface, which leads to high-density mounting.

In the present invention, it is preferable that the electronic component is a discrete component. With this configuration, it becomes unnecessary to develop a built-in component newly, and therefore the development of the module itself can be speeded up. In addition, since the reliability and the accuracy of existing discrete components can be utilized, properties of the module can be improved. Here, the discrete components mentioned above include chip components for general purpose use, such as an inductor, a capacitor, and a resistor. In the following description, the inductor, the capacitor, and the resistor will be generically called "LCR".

In the present invention, it is preferable that the semiconductor is a semiconductor bare chip. With this configuration, compared with a semiconductor package, a module having a small area can be formed, and therefore a module with high density can be provided.

In the aforementioned module, it is preferable that the semiconductor bare chip is flip chip bonded to the wiring pattern and/or the wiring board. With this configuration, a high-density mounted module configured with a short wiring can be realized.

In the aforementioned module, it is preferable that the semiconductor bare chip is ground and/or polished. With this configuration, the thickness of the semiconductor can be reduced, which is effective for realizing a low-profile module.

Preferably, a method of producing the above-stated modules includes a step of mounting the components on the wiring pattern and/or the wiring board after a step of curing the insulating layer. With this method, the component built-in module according to the present invention can be produced effectively.

It is preferable that the semiconductor is ground and/or polished when the semiconductor is in a semiconductor wafer state before mounting. With this method, the semiconductors can be made thinner on a wafer basis at one time, thus improving the productivity.

Alternatively, it is preferable that the semiconductor after mounting is ground and/or polished by utilizing the wiring board for fixing or carrying. With this method, the component built-in module according to the present invention can be produced without handling a thinner semiconductor.

It is preferable that a step of embedding the components in the insulating layer and a step of curing the insulating layer are conducted concurrently. This method enables the production of the component built-in module according to the present invention with a reduced manufacturing steps.

It is preferable that the shielding layer is formed by forming a wiring pattern of copper foil. With this method, the component built-in module according to the present invention can be produced effectively.

It is preferable that the shielding layer is formed by laminating electromagnetic shielding layers. With this method, the component built-in module according to the present invention can be produced effectively.

In the present invention, the components may be arranged inside of the insulating layer so as to oppose to each other. Especially in the case where high-profile and low-profile components are mixed, the arrangement in such a manner that the high-profile component is opposed to the low-profile component can realize high-density mounting.

In the present invention, a thermal expansion coefficient in a thickness direction of the insulating layer may be not more than 10 times a thermal expansion coefficient of the via. With this configuration, when components further are mounted to the outside of the component built-in module, and even when this module is subjected to a solder reflow process, an expansion rate in the thickness direction of the insulating layer does not become large, which can prevent the breakage of the continuity in the via.

Embodiment 1

The following describes embodiments of the present invention, with reference to the drawings. FIG. 1 is a cross-sectional view showing a component built-in module according to Embodiment 1. In FIG. 1, the component built-in module includes an insulating layer 101, a wiring pattern 102, a via 103, a component 104 and a solder 105, and the component built-in module further includes a double-sided board 109 provided with wiring patterns 106 and 108 and an inner via 107.

As the insulating layer 101, an insulating resin, a mixture of a filler and an insulating resin and the like can be used, for example. It is preferable that the insulating layer contains a resin and a filler, where the percentage of filler content ranges from 50 weight % to 95 weight %, inclusive. The insulating layer also may contain a reinforcing material such as glass cloth. As the insulating resin, a thermosetting resin, a thermoplastic resin, a photo-curing resin and the like can be used. A heat-resisting property of the insulating layer 101 can be enhanced by employing an epoxy resin, a phenol resin and an isocyanate resin, which have a high heat-resisting property. In addition, a high frequency property of the insulating layer can be enhanced by employing a resin containing a fluororesin having a low dielectric dissipation factor, such as polytetrafluoroethylene (PTFE) resin and polyphenylene oxide (PPO) resin (also referred to as polyphenylene ether (PPE) resin) and a liquid crystal polymer or a resin obtained by denaturing these resins. In the case of employing a mixture of a filler and an insulating resin as the insulating layer 101, a coefficient of linear expansion, heat conductivity, a dielectric constant and the like of the insulating layer 101 can be controlled easily by selecting the filler and the insulating resin. As the filler, alumina, magnesia, boron nitride, aluminum nitride, silicon nitride, polytetrafluoroethylene and silica can be used, for example. The use of alumina, boron nitride and aluminum nitride enables the production of a board having higher heat conductivity than the conventional glass-epoxy board, so that heat generated from the built-in electronic component 104 can be dissipated effectively. Alumina has another advantage of low cost. In the case of employing silica, the insulating layer 101 having a low dielectric constant can be realized, and by virtue of its small specific gravity, such an insulating layer is preferable for the use at high frequencies, such as for mobile phones. The insulating layer having a low dielectric constant can be formed also by employing silicon nitride and polytetrafluoroethylene, e.g., "Teflon" (registered by Du Pont). The use of boron nitride can reduce a coefficient of linear expansion. The insulating layer further may contain a dispersant, a coloring agent, a coupling agent or a release agent. The use of the dispersant enables the uniform dispersion of a filler into an insulating resin. The use of the coloring agent colors the insulating layer, which facilitates the utilization of an automatic recognition apparatus. The use of the coupling agent can enhance the adhesive strength between an insulating resin and a filler, thus enhancing insulation performance of the insulating layer 101. The use of the release agent can facilitate the release of the mixture from a mold, thus enhancing productivity.

The wiring pattern 102 is made of a material having electrical conductivity, and metal foil, a conductive resin composition and a lead frame processed from a metal sheet, for example, can be used. The use of the metal foil and the lead frame facilitates the formation of a minute wiring pattern by means of etching or the like. In addition, the use of the metal foil enables the formation of a wiring pattern by means of a transferring process using a releasing film. Especially, copper foil is preferable because of low cost and high electrical conductivity. The formation of the wiring pattern on the releasing film facilitates the handling of the wiring pattern. The use of the conductive resin composition enables the production of the wiring pattern by means of a screen printing method or the like. The use of the lead frame enables the use of thick metal having low electrical resistance. Additionally, the use of the lead frame allows minute patterning by etching and a simple method such as stamping to be employed. Furthermore, by plating the surface of these wiring patterns 102, the corrosion resistance and electrical conductivity thereof can be enhanced. In addition, by roughening a contact surface of the wiring pattern 102 with the insulating layer 101, an adhesiveness with the insulating layer 101 can be enhanced. A coupler, a filter and the like can be formed with the wiring pattern. On the outer layer of the wiring pattern 102 also, a semiconductor and/or an electronic component can be mounted.

The via 103 has a function of connecting between the wiring patterns 102, and is made of a thermosetting conductive material, for example. As the thermosetting conductive material, a conductive resin composition in which a metal particle and a thermosetting resin are mixed can be used, for example. As the metal particle, gold, silver, copper, nickel or the like can be used. Gold, silver, copper and nickel are preferable because of high electrical conductivity. Especially, copper is more preferable because of high electrical conductivity and small migration. The use of a metal particle of copper coated with silver also can satisfy both properties of small migration and high electrical conductivity. As the thermosetting resin, an epoxy resin, a phenol resin or an isocyanate resin can be used, for example. The epoxy resin is more preferable because of its high heat-resisting property. The via 103 also can be formed by forming a via hole followed by plating. The via 103 can be formed with a combination of a metal and a solder, and the like.

As the electronic component 104, a chip component such as a capacitor, an inductor, a resistance (LCR) and the like, a diode, a thermistor, a switch and the like can be used, for example. By embedding discrete components, it becomes unnecessary to develop built-in components newly. Additionally, existing components can be utilized as components for the intended use considering the accuracy and the temperature property, which leads to the improvement of the reliability. A printed resistor, a thin film capacitor/inductor and the like may be formed as the electronic component 104.

The solder 105 is used for mounting the electronic component 104 on the wiring pattern 102. In the case of employing a high-temperature solder, remelting of the solder when mounting the module by reflowing can be prevented. The use of a lead-free solder can reduce a load on the environment. Although a solder is employed in this embodiment, a conductive adhesive and the like can be used.

As the double-sided board 109, any board selected from a board in which an epoxy resin is impregnated in a glass fabric (glass-epoxy board), a board in which an epoxy resin is impregnated in an aramid fiber nonwoven fabric (aramid-epoxy board), a board in which a phenol resin is impregnated in paper (paper-phenol board) and a ceramic board and the like can be used in accordance with the intended use.

For instance, compared with a module in which components are individually embedded in an insulating layer without the use of a board and then a wiring pattern is formed on the surface of the insulating layer, although the comparison result might vary according to the type of a board, the type, the amount and the thickness of a ceramic of a composite and the like, the bending strength of a component built-in module according to Embodiment 1, where components are mounted on a double-sided board, such as a glass-epoxy board, which is inspected and then is embedded in an insulating layer, becomes approximately 1.3 times higher on average.

Embodiment 2

Figure 2A:
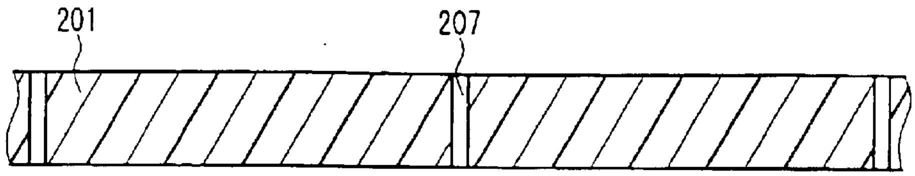
FIGS. 2A to 2D are cross-sectional views showing a manufacturing process of a component built-in module according to Embodiment 2 of the present invention.

Embodiment 2 describes one embodiment of a method of producing the component built-in module illustrated in FIG. 1. Materials used in Embodiment 2 are those described in Embodiment 1. FIGS. 2A to 2D are cross-sectional views showing one embodiment of a manufacturing process of the component built-in module. As shown in FIG. 2A, a through hole 207 is formed in an uncured insulating layer 201. As the insulating layer 201, an insulating resin, a mixture of a filler and an insulating resin and the like can be used. First of all, the filler and the insulating resin are mixed and stirred so as to produce an insulating resin mixture in paste form. A solvent may be added to the insulating resin mixture for the purpose of adjusting the viscosity. This insulating resin mixture is shaped into sheet form, whereby the insulating layer 201 can be formed. As a method for shaping the mixture into sheet form, the mixture may be applied to a film using a doctor blade method and the like. The adhesion of the insulating layer 201 can be reduced by drying it at a temperature not more than the curing temperature. As a result of this heat treatment, the adhesion of the sheet form insulating layer disappears, so that the insulating layer 201 can be peeled from the film easily. By letting the insulating layer 201 a semi-cured state (i.e., B stage), the handling thereof can be eased. The through hole 207 can be formed by laser machining, drilling and punching, for example. The laser machining is preferable because this technology enables the formation of vias with a fine pitch and does not generate scrapings. In the case of employing the laser machining, a $CO_2$ laser, a YAG laser, an excimer laser and the like can be used. In the case of employing the drilling and punching, the through hole can be formed easily with existing facilities for general purpose use. The use of the uncured insulating layer 201 facilitates the machining thereof.

Separately, a wiring pattern 202 is formed on a carrier 206. The wiring pattern 202 can be formed by a method such as etching and printing. Especially, in the case of etching, a method for forming a fine wiring pattern, such as a photolithography method, can be utilized. As the carrier, metal foil such as copper foil and aluminum foil and the like can be used in addition to a resin film such as polyethylene terephthalate (PET) and polyphenylene sulfite (PPS). The use of the carrier 206 facilitates the handling of the wiring pattern 202. A release layer may be provided between the wiring pattern 202 and the carrier 206 for the purpose of facilitating the peeling.

A component 204 is mounted with a solder 205 on a wiring pattern 208 on a double-sided wiring board 211 provided with the wiring pattern 208 and a wiring pattern 210 and an inner via 209 connecting these patterns. Thereafter, at least one inspection selected from mounting inspection and property inspection is conducted. A protective film 212 may coat the wiring pattern 210.

Next, a conductive via paste is filled into the through hole 207 formed as in FIG. 2A. As the conductive via paste, a mixture of conductive powder and a resin, e.g., a mixture of metal powder such as gold, silver, copper, nickel and the like or carbon powder with a thermosetting resin or a photocuring resin, can be used. Copper is preferable because of high electrical conductivity and small migration. A conductive powder made of powder coated with copper may be used. As the resin, a thermosetting resin including an epoxy resin, a phenol resin, an isocyanate resin, or a polyphenylene ether resin can be used, for example. The epoxy resin is preferable because of high heat-resisting property. A photocuring resin also can be used. As a method for filling the via paste, a method such as printing and injection can be used. Especially, when employing a printing method, the wiring pattern also can be formed. The formation of the via 203 enables the connection between the wiring patterns 202 and 208. Space for accommodating the electronic component 204 may be formed in the insulating layer 201. Such formation of the space can suppress the deformation of the via 203.

As a method for mounting the electronic component 204 on the wiring pattern 208 on the double-sided wiring board 211 provided with the wiring patterns 208 and 210 and the inner via 209 connecting these patterns, in addition to the solder mounting with the solder 205 (printing of cream solder and by means of solder ball), a conductive adhesive formed by kneading gold, silver, copper, silver-palladium alloy and the like with a thermosetting resin can be used. A sealing resin may be filled between the mounted electronic component 204 and the double-sided board 211. Such filling of the sealing resin can prevent the formation of a gap between them when embedding the electronic component 204 in the insulating layer 201 in the later step. As the sealing resin, an underfill resin, which is used for normal flip chip bonding, can be used. After mounting, by checking the mounted state, repairs and troubleshooting of the cause of failures can be conducted.

The insulating layer 201 having the via 203 filled with the conductive via paste is arranged under the wiring pattern 202 on which the carrier film 206 is formed and above the double-sided wiring board 211 on which the electronic component 204 is mounted. They are aligned as shown in FIG. 2B and are laminated.

Figure 2B:
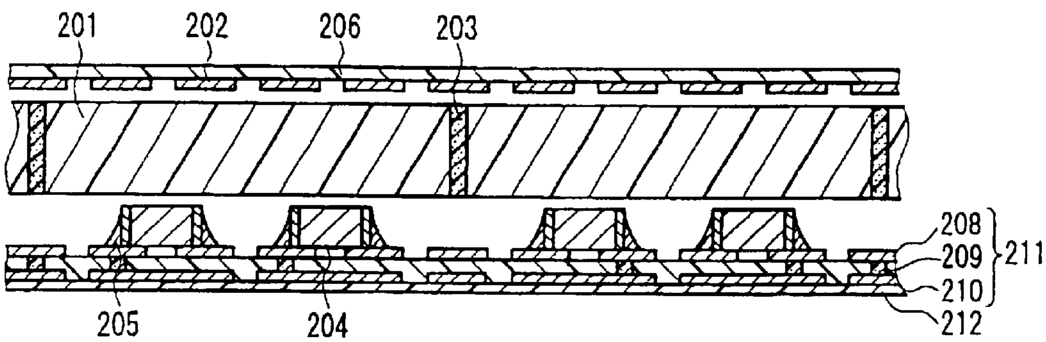
Figure 2C:
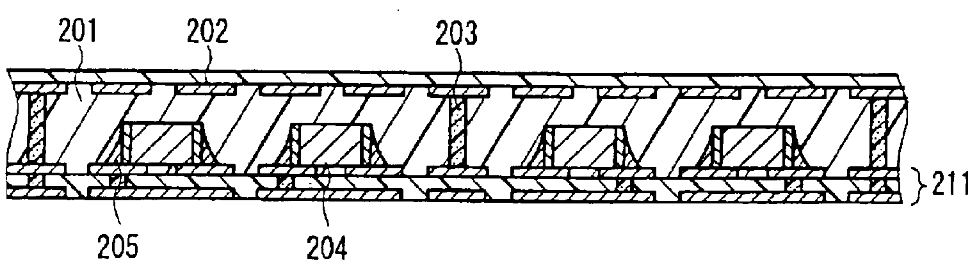
Figure 2D:
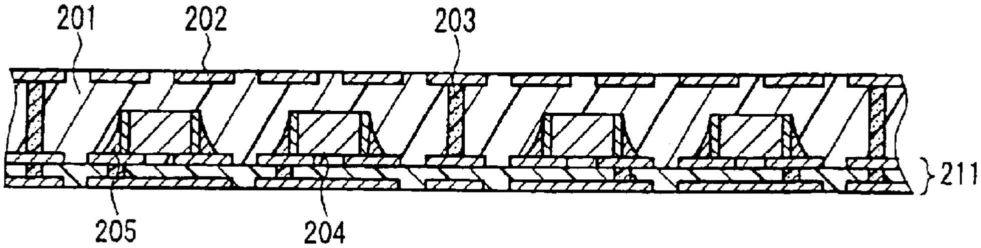

Following the lamination shown in FIG. 2B, as shown in FIG. 2C, pressure is applied so that the electronic component 204 can be embedded in the insulating layer 201. In the case of employing a thermosetting resin as the insulating resin, heat is applied after the application of pressure so as to cure the thermosetting resin contained in the insulating layer 201, whereby a sheet-form insulating layer 201 in which the electronic components 204 are embedded can be formed. Heat is applied at a temperature not less than a temperature for curing the thermosetting resin. Through this process, the insulating layer 201 and the electronic component 204 are bonded mechanically and firmly. Note here that when curing the thermosetting resin by the application of heat, pressure ranging from 100 $g/mm^2$ to 2 $kg/mm^2$ is applied at the same time, whereby the mechanical strength of the semiconductor device can be enhanced. Instead of using the sheet-form insulating layer, the material may be processed into powder or pellet form, and may be melted and poured into a mold. Alternatively, after pouring it in powder form into a mold, melting molding may be conducted. As a method for filling the insulating resin layer, transfer molding and injection molding can be used.

After curing the insulating layer 201, the carrier 206 is peeled off, so that the insulating layer 201 in which the electronic component 204 is embedded can be produced. Thus, as described in Embodiment 1, a semiconductor device integrated with the double-sided wiring board 211 can be formed.

Embodiment 3

Figure 3:
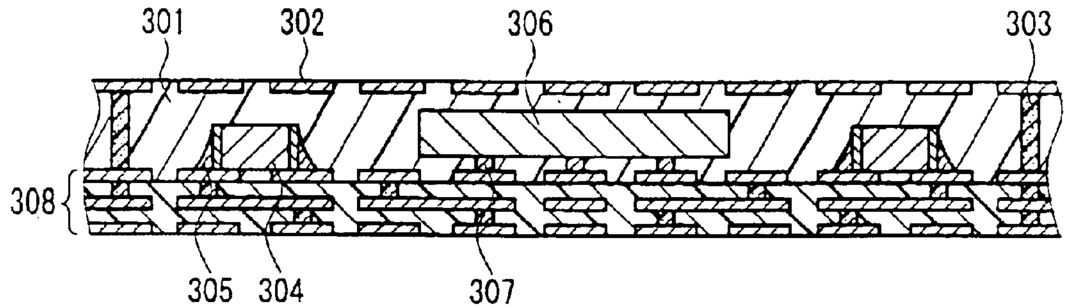
FIG. 3 is a cross-sectional view showing a component built-in module according to Embodiment 3 of the present invention.

Embodiment 3 describes one embodiment of a component built-in module. The following describes this embodiment, with reference to FIG. 3. The component built-in module according to this embodiment is the same in the above-stated Embodiment 1 except for a semiconductor 306, a bump 307 and a three-layered wiring board 308. Therefore, materials used in Embodiment 3 are the same as in Embodiments 1 and 2, unless otherwise described. In FIG. 3, the component built-in module includes an insulating layer 301, a wiring pattern 302, a via 303, an electronic component 304, a conductive adhesive 305, the semiconductor 306, the bump 307 and the wiring board 308.

The semiconductor 306 may be mounted on the wiring board 308 in the same manner as the electronic component 304. By embedding the semiconductor 306 in the insulating layer 301, a high-performance module can be realized. As the semiconductor 306, a semiconductor device such as a transistor, an IC and an LSI can be used. The semiconductor 306 may be a package or a semiconductor bare chip. The semiconductor 306 may be sealed with a sealing resin at least at a portion of the semiconductor 306 and a connection among the semiconductor 306, the bump 307 and the wiring board 308. Such filling of the sealing resin can prevent the formation of a gap between the wiring board 308 and the semiconductor 306 when embedding the semiconductor 306 in the insulating layer 301. As the sealing resin, an underfill resin, which is used for normal flip chip bonding, can be used. For the connection between the wiring board 308 and the semiconductor 306, a conductive adhesive, an anisotropic conductive film (ACF), a nonconductive film (NCF) and a bump are used in the case of the flip chip bonding, for example. In addition, the use of a chip size package (CSP) facilitates the mounting process.

The bump 307 connects the semiconductor 306 and the wiring board 308. As the bump 307, metal such as gold, copper and solder can be used, for example. The bump 307 can be formed by wire bonding, plating, printing and the like.

The wiring board 308 is a general wiring board that is a double-sided board, a build-up board and a multilayer board connected with inner vias, which are configured with glass-epoxy boards and ceramic boards, and is made up of an insulating layer, a wiring pattern and a via. The insulating layer may contain a reinforcing material such as glass cloth in addition to an insulating resin, a mixture of a filler and an insulating resin and ceramic. Alternatively, the same material as in Embodiments 1 and 2 can be used. This holds true for the wiring pattern and the via. The use of the same material as in the insulating layer 301 makes their thermal expansion coefficients and the like uniform, which enhances the reliability. Additionally, before embedding in the insulating layer, the mounted state of the semiconductor 306 and the electronic component 304 on the wiring board 308 is checked. Thereby, the yields of the products can be increased and repairs and troubleshooting of the cause of failures can be conducted. It is effective that checking is conducted after both the electronic component 304 and the semiconductor 306 are mounted, because the operation of the semiconductor 306 can be confirmed. The provision of the wiring board 308 facilitates the application to a complicated circuit, rewiring of the semiconductor, and the like, and therefore this configuration is suitable for a module having complicated functions.

Note here that although this embodiment deals with the example where the wiring patterns of the wiring board have a three-layered structure, the number of layers is not limited to this example but any number of layers can be used.

For instance, compared with a module in which components are individually embedded in an insulating layer without the use of a board and then a wiring pattern is formed on the surface of the insulating layer, although the comparison result might vary according to the type of a board, the type, the amount and the thickness of a ceramic of a composite and the like, the bending strength of a component built-in module according to Embodiment 3, where components are mounted on a three-layered board, such as a glass-epoxy board, which is inspected and then is embedded in an insulating layer, becomes approximately 1.3 times higher on average.

Embodiment 4

Figure 4:
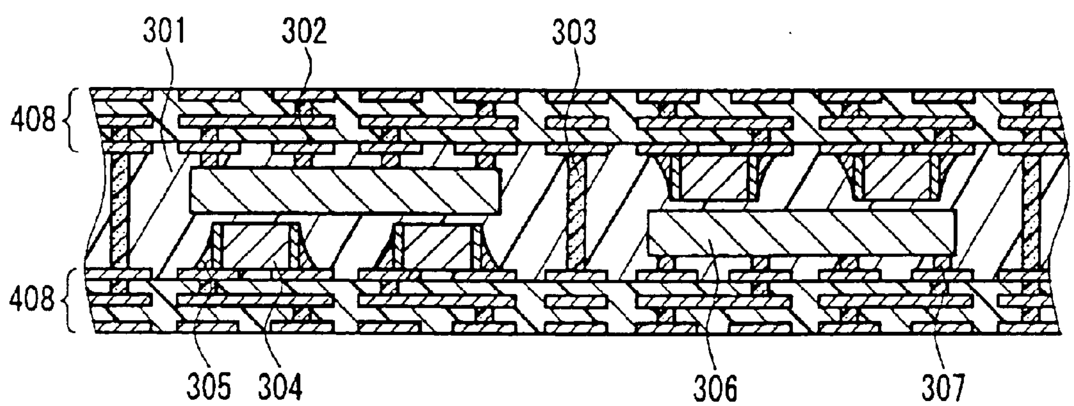
FIG. 4 is a cross-sectional view showing a component built-in module according to Embodiment 4 of the present invention.

Embodiment 4 describes another embodiment of a component built-in module. The following describes this embodiment, with reference to FIG. 4. The component built-in module according to this embodiment is the same as the above-stated Embodiments 1 to 3 except that three-layered wiring boards 408 are provided on both surfaces and an electronic component 404 and a semiconductor 406 are opposed to each other. Therefore, this embodiment is the same as in Embodiments 1 to 3 as to matters that are not described especially, and the elements and the manufacturing steps having the same designations have the same functions as in the above Embodiments unless otherwise specified.

Unlike Embodiment 3, the wiring boards 408 are arranged on the top and bottom of the module, which facilitates the application to a complicated circuit, rewiring of the semiconductor, and the like, and therefore this configuration is suitable for a module having complicated functions. In addition, a component built-in module with high density can be formed simply by adding a step of embedding a semiconductor and an electronic component after a step of mounting the semiconductor and the electronic component on a wiring board included in a normal module formation process.

Embodiment 5

Figure 5:
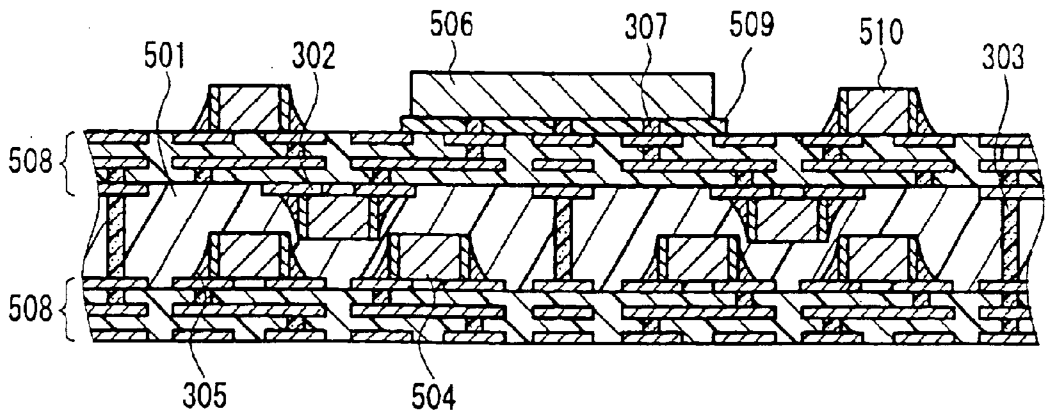
FIG. 5 is a cross-sectional view showing a component built-in module according to Embodiment 5 of the present invention.

Embodiment 5 describes still another embodiment of a component built-in module. The following describes this embodiment, with reference to FIG. 5. The component built-in module according to this embodiment is the same as the above-stated Embodiments 1 to 4 except for an electronic component 510 and a semiconductor 510 mounted on a surface of the module and a configuration of a component built-in layer. Therefore, this embodiment is the same as in Embodiments 1 to 4 as to matters that are not described especially, and the elements and the manufacturing steps having the same designations have the same functions as in the above Embodiments unless otherwise specified.

An electronic component 504 in an insulating layer 501 is mounted according to a mounting process in a normal module formation process in the same manner as in Embodiment 4. However, due to the limitation of the performance of a mounter for mounting the electronic component 504, space has to be kept between electronic components. In this embodiment, with consideration given to a space between mounted components, opposite wiring boards 508 are arranged so that the electronic components 504 are positioned differently between the upper and lower wiring boards. As a result, the number of components mounted on one area can be increased and the thickness of the built-in layer can be made small, and therefore a configuration suitable for high-density mounting can be realized. Reference numeral 509 denotes an NCF.

The electronic component 510 and the semiconductor 506 can be mounted on the surface according to the same process as that employed in a normal module formation process. With increasing the number of mounting surfaces, higher-density mounting can be realized, and therefore a configuration suitable for a multi-function module can be realized.

Embodiment 6

Figure 6:
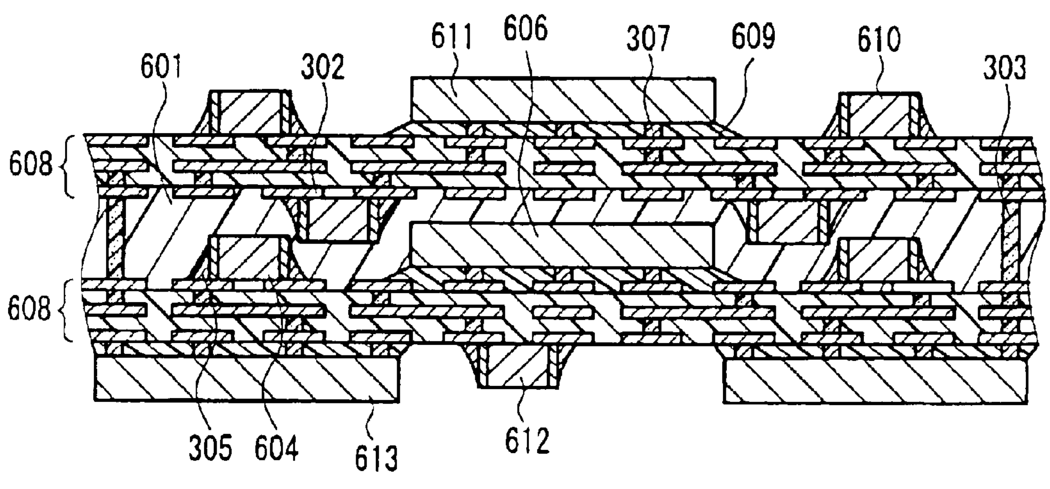
FIG. 6 is a cross-sectional view showing a component built-in module according to Embodiment 6 of the present invention.

Embodiment 6 describes a further embodiment of a component built-in module. The following describes this embodiment, with reference to FIG. 6. The component built-in module according to this embodiment is the same as the above-stated Embodiments 1 to 5 except for electronic components 610 and 612 and semiconductors 611 and 613 mounted on a surface of the module and a configuration of a component built-in layer. Therefore, this embodiment is the same as in Embodiments 1 to 5 as to matters that are not described especially, and the elements and the manufacturing steps having the same designations have the same functions as in the above Embodiments unless otherwise specified.

An electronic component 604 and a semiconductor 606 in an insulating layer 601 are mounted according to a mounting process in a normal module formation process in the same manner as in Embodiments 4 and 5. However, space is required around the semiconductor 606 for rewiring that is conducted in a flip chip bonding process, which makes it difficult to arrange electronic components close to the semiconductor. Then, according to this embodiment, electronic components 604 are mounted on the opposite wiring board 608 so as to allow the electronic components 604 to be arranged close to the semiconductor 606. As a result, the number of components mounted on one area can be increased, and therefore a configuration suitable for high-density mounting can be realized. Reference numeral 609 denotes a sealing resin.

The electronic component 610 and the semiconductor 606 can be mounted on the surface according to the same process as that employed in a normal module formation process. By mounting these components and semiconductors on both surfaces, higher-density mounting can be realized, and therefore a configuration suitable for a multi-function module can be realized.

Embodiment 7

Figure 7A:
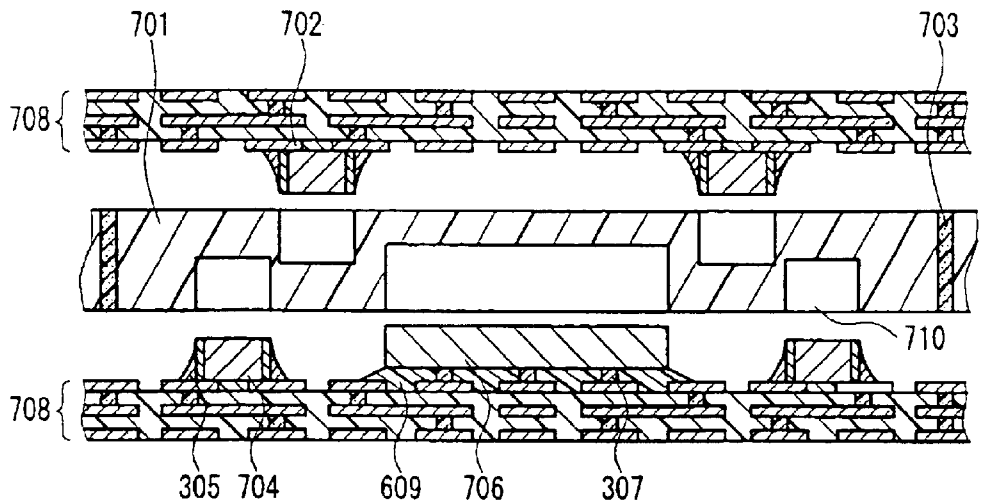
FIGS. 7A to 7C are cross-sectional views showing a manufacturing process of a component built-in module according to Embodiment 7 of the present invention.
Figure 7B:
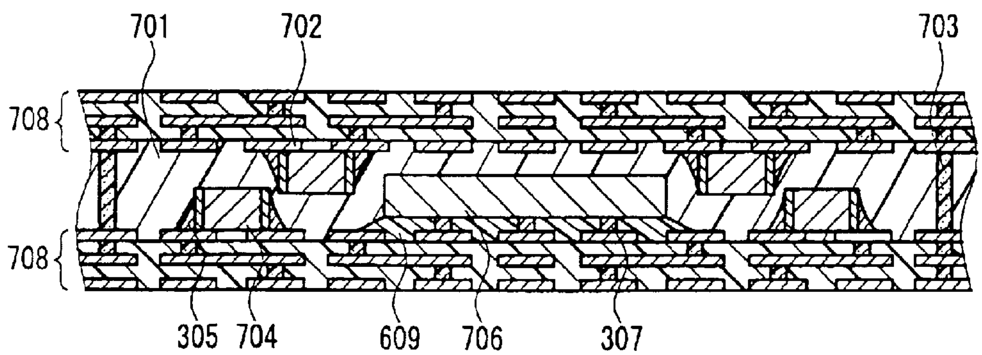
Figure 7C:
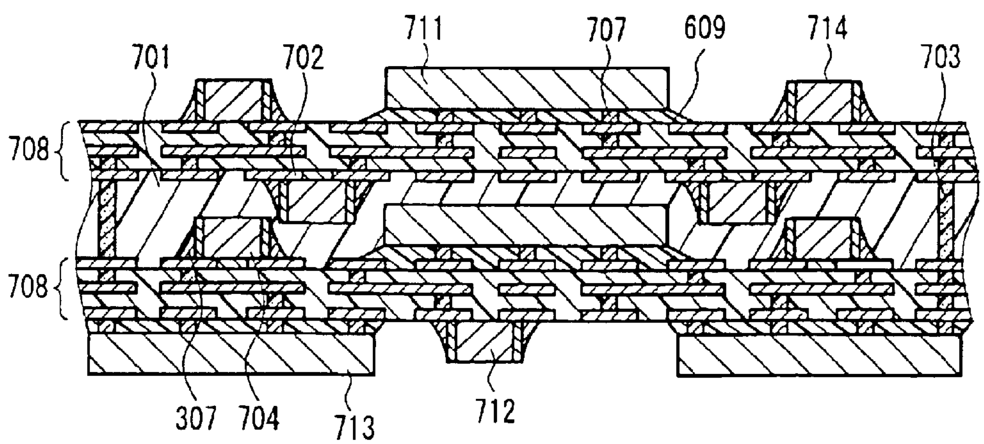

Embodiment 7 describes one embodiment of a method of producing the component built-in module shown in FIGS. 7A to 7C. The following describes this embodiment, with reference to the drawings. Materials in this embodiment are the same as in the above embodiment unless otherwise described, and the elements and the manufacturing steps having the same designations have the same functions as in the above embodiment unless otherwise specified. FIGS. 7A to 7C are cross-sectional views showing a manufacturing process of the component built-in module. As shown in FIG. 7A, wiring boards 708 and an insulating layer 701 are aligned and laminated, where a semiconductor 706 and an electronic component 704 are mounted on the wiring board 708, and an air gap 710 is formed in the insulating layer 701. After mounting, the wiring boards 708 may be checked as to the mounted state and may be subjected to repairs. The air gap 710 formed in the insulating layer 701 has a volume equal to or less than a volume of the built-in semiconductor 706 and the electronic component 704, which can prevent the formation of a gap between them after embedding.

Next, as shown in FIG. 7B, after the lamination, pressure is applied thereto, so that the semiconductor 706 and the electronic component 704 can be embedded in the insulating layer 701. After embedding, heat is applied so as to cure the insulating layer 701. Then, wiring patterns 702 are connected with a via 703.

After curing the insulating layer 701, as shown in FIG. 7C, semiconductors 711 and 713 and electronic components 714 and 712 are mounted on surfaces, so that the component built-in module can be provided.

Embodiment 8

Figure 8:
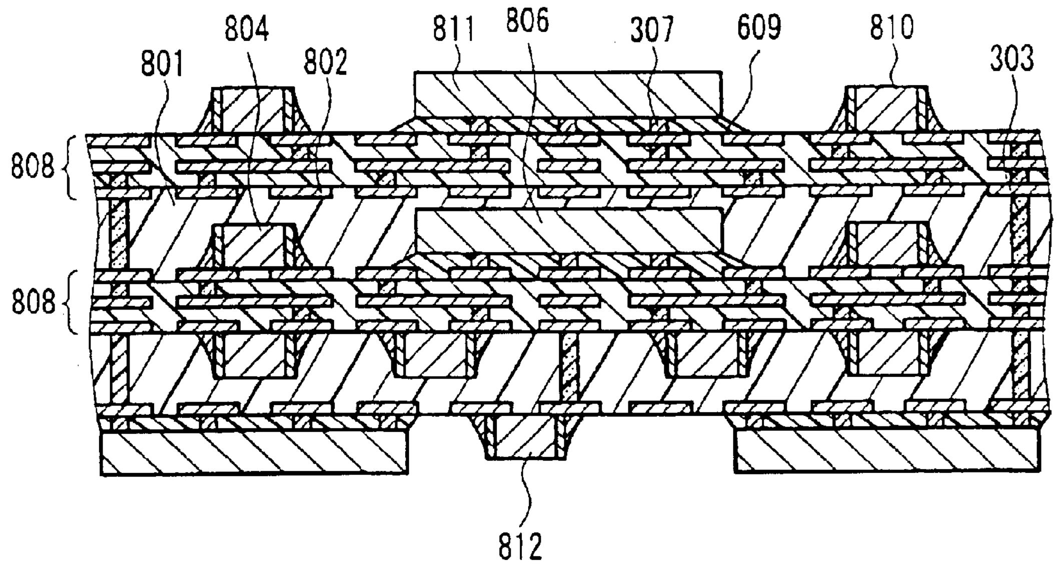
FIG. 8 is a cross-sectional view showing a component built-in module according to Embodiment 8 of the present invention.

Embodiment 8 describes a still further embodiment of a component built-in module. The following describes this embodiment, with reference to FIG. 8. The component built-in module according to this embodiment is the same as the above-stated Embodiments 1 to 7 except for a configuration of a component built-in layer. Therefore, this embodiment is the same as in Embodiments 1 to 7 as to matters that are not described especially, and the elements and the manufacturing steps having the same designations have the same functions as in the above Embodiments unless otherwise specified.

An electronic component 804 and a semiconductor 806 in an insulating layer 801 are mounted according to a mounting process in a normal module formation process. However, the mounting of these elements on both surfaces of a wiring board 808 allows the number of component built-in layers to be increased easily. That is to say, an electronic component 810 and a semiconductor 811 are mounted on an upper surface of the three-layered wiring board 808 via a wiring pattern 802, and an insulating layer in which electronic components are embedded is connected to a lower surface of the three-layered wiring board 808, and an electronic component 812 is connected to a surface of the insulating layer. As a result, the number of components mounted on one area can be increased, and therefore a configuration suitable for higher-density mounting can be realized.

Embodiment 9

Figure 9:
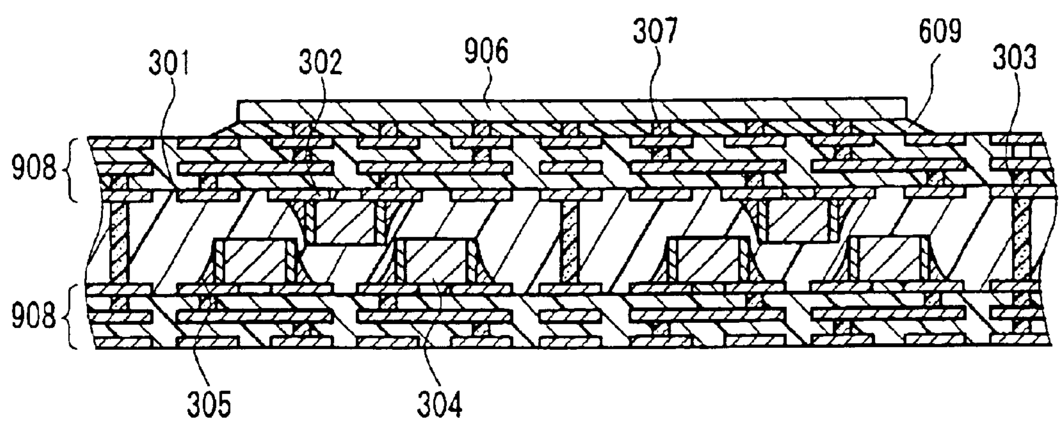
FIG. 9 is a cross-sectional view showing a component built-in module according to Embodiment 9 of the present invention.

Embodiment 9 describes another embodiment of a component built-in module. The following describes this embodiment, with reference to FIG. 9. The component built-in module according to this embodiment is the same as the above-stated Embodiments 1 to 8 except for a matter for making a semiconductor thinner. Therefore, this embodiment is the same as Embodiments 1 to 8 as to matters that are not described especially, and the elements and the manufacturing steps having the same designations have the same functions as in the above Embodiments unless otherwise specified.

By making a semiconductor 906 thinner, the thickness of the component built-in module can be reduced. As a method of making the semiconductor thinner, a method of polishing a semiconductor wafer and then mounting the same and a method of mounting the semiconductor 906 on a wiring board 908 and then grinding/polishing the same are available. The former case has an advantage in the productivity because the semiconductor 906 can be processed on a wafer basis. The latter case can improve the workability because this method eliminates the necessity of handling a thinner semiconductor 906. Note here that the semiconductor 906 may be mounted not only on the surface but also inside of the module.

Embodiment 10

Figure 10:
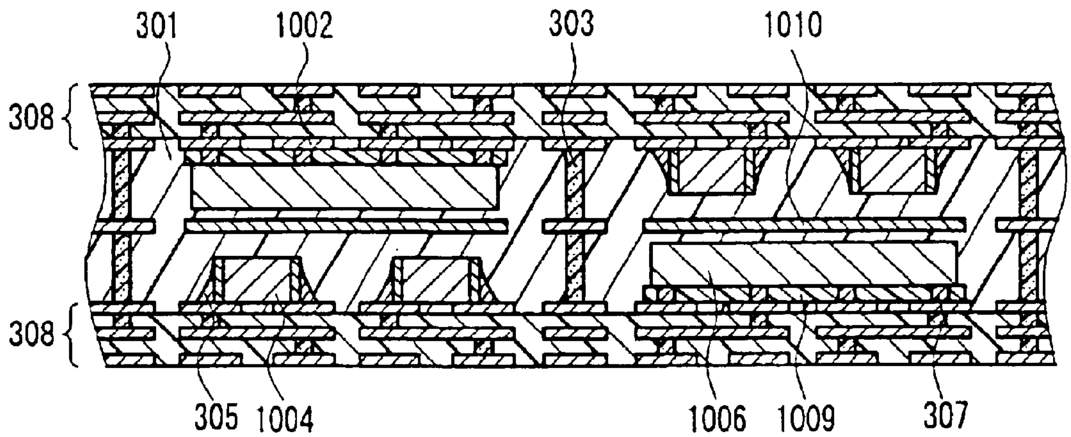
FIG. 10 is a cross-sectional view showing a component built-in module according to Embodiment 10 of the present invention.

Embodiment 10 describes still another embodiment of a component built-in module. The following describes this embodiment, with reference to FIG. 10. The component built-in module according to this embodiment is the same as the above-stated Embodiments 1 to 9 except for forming a shield electrode 1010. Therefore, this embodiment is the same as in Embodiments 1 to 9 as to matters that are not described especially, and the elements and the manufacturing steps having the same designations have the same functions as the above Embodiments unless otherwise specified. Reference numeral 1009 denotes an ACF.

A shield electrode 1010 can be formed using the same materials and manufacturing process as those for a wiring pattern 1002. The formation of the shield electrode 1010 can reduce interference among built-in semiconductors 1006 and electronic components 1004. By controlling the shield electrode 1010 to be at a ground potential, the module can be stabilized. Note here that the shield electrode is not limited to a single layer structure.

Embodiment 11

Figure 11:
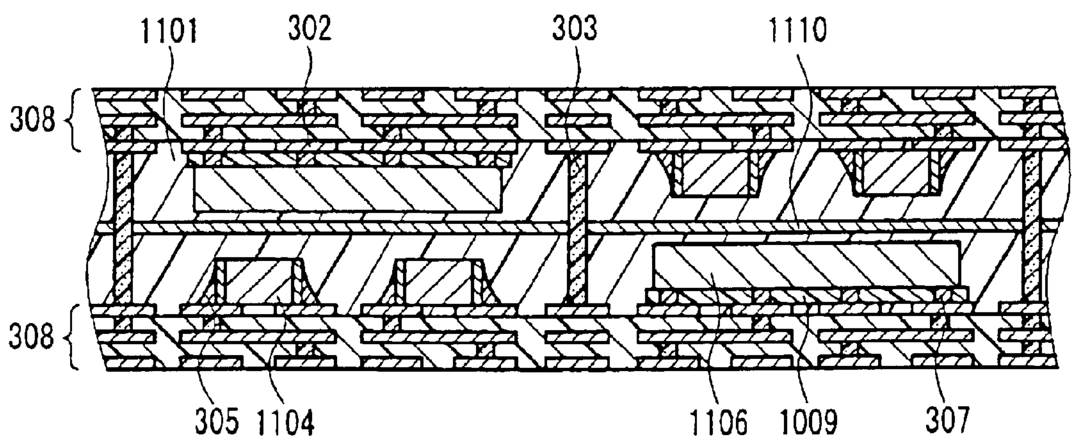
FIG. 11 is a cross-sectional view showing a component built-in module according to Embodiment 11 of the present invention.

Embodiment 11 describes a further embodiment of a component built-in module. The following describes this embodiment, with reference to FIG. 11. The component built-in module according to this embodiment is the same as the above-stated Embodiments 1 to 10 except for forming an electromagnetic shielding layer 1110. Therefore, this embodiment is the same as Embodiments 1 to 10 as to matters that are not described especially, and the elements and the manufacturing steps having the same designations have the same functions as in the above Embodiments unless otherwise specified.

An electromagnetic shielding layer 1110 can be formed simply by changing a filler contained in an insulating layer 1101 and can reduce the interference of electromagnetic waves among built-in semiconductors 1106 and electronic components 1104. As the filler, a material having a high complex magnetic permeability and capable of absorbing electromagnetic waves (and converting it into heat) can be used. For example, ferrite powder can be used. A shielding function can be added using the same process for the insulating layer 1101. Note here that the electromagnetic shielding layer 1110 is not limited to a single layer structure.

Embodiment 12

Embodiment 12 describes a still further embodiment of a component built-in module. The following describes this embodiment, with reference to FIG. 12. The component built-in module according to this embodiment is the same as the above-stated Embodiments 1 to 11 except for electronic components **1204*a* and 1204*b* in an insulating layer 1201**. Therefore, this embodiment is the same as in Embodiments 1 to 11 as to matters that are not described especially, and the elements and the manufacturing steps having the same designations have the same functions as in the above Embodiments unless otherwise specified.

Figure 12:
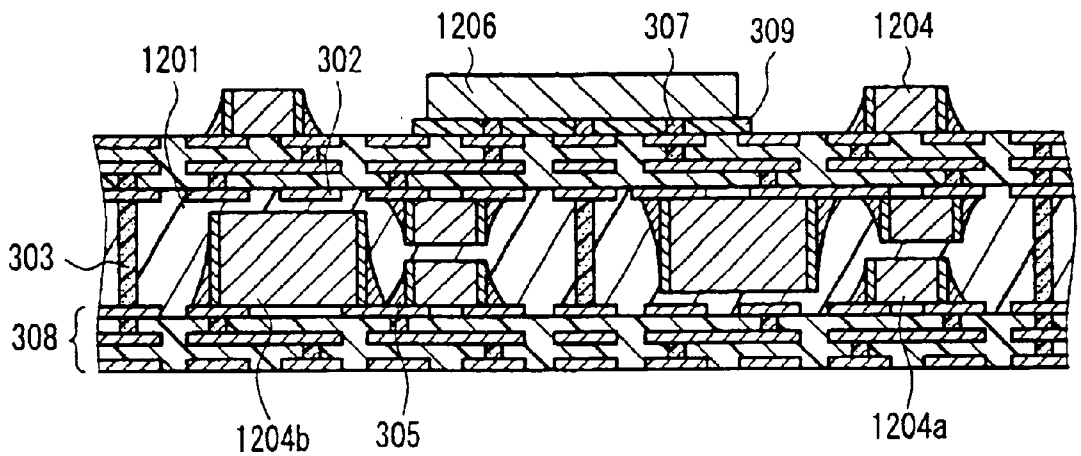
FIG. 12 is a cross-sectional view showing a component built-in module according to Embodiment 12 of the present invention.

The electronic components **1204*a* and 1204*b* in the insulating layer 1201 are mounted according to a mounting process in a normal module formation process. However, these electronic components might have different sizes depending on the size of the capacitor and the like. In this embodiment, a difference in height between the electronic components 1204*a* and 1204*b* is utilized effectively so as to improve the mounting density. As shown in FIG. 12, the low-profile electronic components 1204*a* are mounted to oppose each other, whereby space above the electronic component 1204*a***, which might be wasted normally, can be utilized effectively, and therefore a configuration suitable for high-density mounting can be realized.

The electronic component 1204 and the semiconductor 1206 can be mounted on the surface according to the same process as that employed in a normal module formation process. With increasing the number of mounting surfaces, higher-density mounting can be realized, and therefore a configuration suitable for a multi-function module can be realized.

As stated above, according to the present invention, a component built-in module includes an insulating layer, wiring patterns formed on both main surfaces of the insulating layer, a via connecting the wiring patterns, and an electronic component and/or a semiconductor mounted on the wiring patterns, which are arranged inside of the insulating layer. With this configuration, a slim and high-density mounted component built-in module can be provided.

EXAMPLES

Example 1

In this example, an insulating layer was produced with the following process. A thermosetting epoxy resin in liquid form and $SiO_2$ as a filler were mixed by means of a mixer so as to produce a mixture paste, where the filler was weighed so as to be present in a mass ratio of 70%. The thus produced mixture paste was processed into sheet form with a thickness of 700 μm on a release film (thickness: 75 μm) made of polyethylene terephthalate (PET) by a doctor blade method. After processing into the sheet form, a drying process at 105° C. was conducted so as to obtain an uncured insulating layer. The weight ratio between the liquid form epoxy resin and the filler can be selected from a range not more than 96% (weight ratio of the filler), which can maintain the sheet form. As for the thickness of the sheet, 200 μm or less is preferable in view of the ease of a drying process. However, a thicker sheet may be formed or sheets may be laminated after the formation of the sheets so as to become a desired thickness, depending on the height of built-in components.

Next, a through hole (diameter ϕ: 150 μm) was formed at a position where an inner via was to be formed by using a $CO_2$ laser. After the formation of the through hole, a via paste made of a mixture of copper powder (particle diameter: less than 7 μm) and a thermosetting epoxy resin was filled by printing. When filling the paste by printing, a squeegee was used where the PET film served as a mask. A smaller diameter of the through hole is suitable for high-density mounting, and the size not more than 600 μm is available for practical purposes.

In parallel to the above-stated processes, 15 μm thick copper foil with one side being roughened was applied on a PET carrier film (thickness: 75 μm) with an adhesive and a photoresist film was applied with a laminater. The thus prepared lamination was subjected to an exposure to a ultra-violet light, development and etching using ferric chloride, so that a wiring pattern was formed. As a design rule for the wiring, the minimum L/S (line/space) was designated as 100/100 (μm). A smaller L/S is suitable for high-density mounting, and 200/200 μm or less is appropriate for mounting a semiconductor bare chip.

Then, electronic components and/or semiconductors were mounted on the wiring pattern. For mounting the electronic components, a conductive adhesive was used. The conductive adhesive was applied onto the wiring pattern with a screen plate (mesh: #400 per inch), 1005 sized electronic components were arranged, and the adhesive was cured at 150° C. using a drier. As the electronic components, chip components such as LCR, a thermistor, and a diode were used depending on a module to be constituted. Smaller sized electronic components are suitable for high-density mounting, and 1.6 mm or less (3216 size) is preferable. For mounting the semiconductors, in the case of a package, a conductive adhesive was used in the same manner as in the electronic components. In the case of a bare chip, a gold bump was formed and mounting was conduced by flip chip bonding. In addition, similarly, electronic components and/or semiconductors were mounted on a wiring board also. In the case of the wiring board, the electronic components were mounted with a solder.

As for the thus mounted electronic components, visual inspection was conducted, and portions where a mounting error (including disconnection of components and an unfavorable standing state of components) occurred were repaired. As for the mounted semiconductors also, their mounted state was confirmed by checking electrical connections. Thereafter, functions of circuit blocks were inspected and the properties of the semiconductors themselves were confirmed. Portions where the property errors occurred were replaced.

Example 2

In this example, test samples having configurations as shown in FIG. 12 were produced. That is, wiring boards were arranged on the top and bottom of an insulating layer in which electronic components were embedded, where the upper and lower wiring boards were connected with vias. As the electronic components, 0603 sized chip components were used. As the insulating layer, test samples having different thermal expansion coefficients were produced, where the insulating layer contained $SiO_2$ as a filler and their thermal expansion coefficients were changed by adjusting the mass ratio of the filler contained. The thickness of the insulating layers was 400 $\mu$m. As wiring boards, glass-epoxy boards (A boards) and boards made of the same material as that of the insulating layer (B boards) were used. The thickness of the wiring boards was 400 $\mu$m. The vias used were made of a mixture of copper powder and a resin. Thermal expansion coefficients of the vias, the insulating layers (only insulating layer), and the insulating layers as structures are shown in the following Table 1.

TABLE 1

Sample No. and Thermal Expansion Coefficients (unit: ppm)

| | Sample No. | | | | | | | | | |
|---|---|---|---|---|---|---|---|---|---|---|
| | 1 | 2 | 3 | 4 | 5 | 6 | 7 | 8 | 9 | 10 |
| Wiring Board | A | B | A | B | A | B | A | B | A | B |
| Via | 30 | | | | | | | | | |
| Only Insulating Layer | 20 | | 47 | | 100 | | 150 | | 200 | |
| Insulating Layer as Structure | 43 | 17 | 98 | 45 | 190 | 101 | 301 | 155 | 488 | 200 |
| Insulating Layer/Via | 1.43 | 0.57 | 3.27 | 1.50 | 6.33 | 3.37 | 10.0 | 5.17 | 16.3 | 6.67 |

Then, the insulating layer and the wiring pattern on which the electronic components and/or the semiconductors were mounted, which were produced in the above-described processes, were aligned with reference to recognition marks, were laminated, and pressure (5 MPa) was applied. As a result of the applied pressure, the electronic components and/or the semiconductors were embedded in the insulating layer. After embedding, while applying the same pressure thereto, heat is applied at 200° C. for 2 hours so as to cure the insulating layer. Concurrently with the curing of the insulating layer, the wiring pattern was transferred.

After curing the insulating layer, the PET carrier was peeled off, so that a component built-in module was formed. This component built-in module has space for mounting electronic components and/or semiconductors on its surfaces and electronic components and/or semiconductors arranged inside also. Therefore, compared between the component built-in module of this embodiment and a normal two-dimensional (i.e., surface mounting) mounted module, both having the same area, about twice components can be mounted in the module of this embodiment. Conversely, when mounting the same number of components as on the normal two-dimensional (surface-mounting) module on the module of this embodiment, about half area is all that is needed.

Compared between the wiring boards made of glass-epoxy (A board) and the wiring boards made of the same material as of the insulating layer (B board), the thermal expansion coefficients configured as the structures are different from each other. Since the insulating layer and the B boards do not contain reinforcing materials, they exhibit isotropic thermal expansion coefficients in the X, Y and Z directions On the other hand, the glass-epoxy boards contain the glass cloth, and their thermal expansion coefficients are considerably different between the X, Y direction and the Z direction. The thermal expansion coefficients of the A boards were 10 ppm in the X, Y direction and 150 ppm in the Z direction. When configured as the structures, the insulating layers adhere to the wiring boards, and therefore the insulating layers are fixed forcefully in the X, Y direction due to the wiring boards (A boards) having a high Young's modulus. As a result, the insulating layers cannot expand in the X, Y direction, so that the thermal expansion coefficient in the Z direction is increased. In the case of employing the B boards made of the same material as the wiring boards, naturally, the thermal expansion coefficients do not change. The resistance value (i.e., the number of opens) of the vias was investigated as to the thus produced samples after being subjected to a thermal cycling test (−50° C. to 270° C.) (See Table 2).

TABLE 2

| | Sample No. | | | | | | | | | |
|---|---|---|---|---|---|---|---|---|---|---|
| | 1 | 2 | 3 | 4 | 5 | 6 | 7 | 8 | 9 | 10 |
| Insulating Layer/Via | 1.43 | 0.57 | 3.27 | 1.50 | 6.33 | 3.37 | 10.0 | 5.17 | 16.3 | 6.67 |
| Number of Opens (/1000) | 0 | 0 | 0 | 1 | 0 | 0 | 0 | 2 | 195 | 1 |

As a result of this investigation, a lot of opens were generated in No. 9 samples. It can be considered that this is due to a difference in thermal expansion coefficient between the via and the insulating layer. Even when the insulating layer is made of the same material, a difference in thermal expansion coefficients when configured as the structures exerts an influence on the reliability of the vias. By setting the ratio of thermal expansion coefficients at 10 or less, a component built-in module with a high degree of reliability can be provided.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A component built-in module comprising an insulating layer, wirings integrated with both surfaces of the insulating layer, a via connecting the wirings, and one or more components selected from an electronic component and a semiconductor, which is embedded inside of the insulating layer, wherein at least one of the wirings is formed on a surface of a wiring board, the components embedded inside of the insulating layer are mounted on and integrated with the wiring board before embedding, and a thermal expansion coefficient in a thickness direction of the insulating layer is not more than 10 times a thermal expansion coefficient of the via.

2. The component built-in module according to claim 1, further comprising at least one component selected from an electronic component and a semiconductor, which is mounted on an outer main surface of the wiring board.

3. The component built-in module according to claim 1, wherein the wiring board is at least one board selected from a double-sided wiring board and a multilayered wiring board.

4. The component built-in module according to claim 1, wherein the components have undergone at least one inspection selected from a mounting inspection and a property inspection before embedding.

5. The component built-in module according to claim 1, wherein the components are arranged so as not to coincide with each other along a cross-sectional direction of the module.

6. The component built-in module according to claim 1, wherein a shielding layer is inserted between at least one pair of components that are arranged inside of the insulating layer and mounted on wiring boards provided on the both main surfaces of the insulating layer.

7. The component built-in module according to claim 6, wherein the shielding layer is a wiring pattern of metal foil or is made of a material having a function of electromagnetic shielding.

8. The component built-in module according to claim 1, wherein the electronic component is a discrete component.

9. The component built-in module according to claim 1, wherein the semiconductor is a semiconductor bare chip.

10. The component built-in module according to claim 9, wherein the semiconductor bare chip is flip chip bonded to the wiring.

11. The component built-in module according to claim 9, wherein the semiconductor bare chip is ground or polished.

12. The component built-in module according to claim 1, wherein the components are arranged inside of the insulating layer so as to oppose each other.

13. The component built-in module according to claim 1, wherein the insulating layer contains a resin and a filler, where a percentage of the filler content ranges from 50 weight % to 95 weight %, inclusive.

14. A component built-in module comprising an insulating layer, wirings integrated with both surfaces of the insulating layer, a via connecting the wirings, and one or more components selected from an electronic component and a semiconductor, which is embedded inside of the insulating layer, wherein at least one of the wirings is formed on a surface of a wiring board, the components embedded inside of the insulating layer are mounted on and integrated with the wiring board before embedding, and a shielding layer is inserted between at least one pair of components that are arranged inside of the insulating layer and mounted on wiring boards provided on the both main surfaces of the insulating layer.

15. The component built-in module according to claim 14, further comprising at least one component selected from an electronic component and a semiconductor, which is mounted on an outer main surface of the wiring board.

16. The component built-in module according to claim 14, wherein the wiring board is at least one board selected from a double-sided wiring board and a multilayered wiring board.

17. The component built-in module according to claim 14, wherein the components have undergone at least one inspection selected from a mounting inspection and a property inspection before embedding.

18. The component built-in module according to claim 14, wherein the components are arranged so as not to coincide with each other along a cross-sectional direction of the module.

19. The component built-in module according to claim 14, wherein the shielding layer is a wiring pattern of metal foil or is made of a material having a function of electromagnetic shielding.

20. The component built-in module according to claim 14, wherein the electronic component is a discrete component.

21. The component built-in module according to claim 14, wherein the semiconductor is a semiconductor bare chip.

22. The component built-in module according to claim 21, wherein the semiconductor bare chip is flip chip bonded to the wiring.

23. The component built-in module according to claim 21, wherein the semiconductor bare chip is ground or polished.

24. The component built-in module according to claim 14, wherein the components are arranged inside of the insulating layer so as to oppose each other.

25. The component built-in module according to claim 14, wherein a thermal expansion coefficient in a thickness direction of the insulating layer is not more than 10 times a thermal expansion coefficient of the via.

26. The component built-in module according to claim 14, wherein the insulating layer contains a resin and a filler, where a percentage of the filler content ranges from 50 weight % to 95 weight %, inclusive.

* * * * *